United States Patent
Bruce et al.

(10) Patent No.: US 6,956,385 B1
(45) Date of Patent: *Oct. 18, 2005

(54) INTEGRATED CIRCUIT DEFECT ANALYSIS USING LIQUID CRYSTAL

(75) Inventors: Michael R. Bruce, Austin, TX (US); David H. Eppes, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 291 days.

This patent is subject to a terminal disclaimer.

(21) Appl. No.: 09/915,883

(22) Filed: Jul. 26, 2001

(51) Int. Cl.[7] ............... G01R 31/302; G01K 11/00
(52) U.S. Cl. ............... 324/752; 324/753; 324/760; 324/770; 374/161
(58) Field of Search ............ 374/5, 161; 324/750–765, 324/751, 752

(56) References Cited

U.S. PATENT DOCUMENTS

| | | | | |
|---|---|---|---|---|
| 398,681 A | * | 2/1889 | White | ............... 4/345 |
| 3,934,199 A | * | 1/1976 | Channin | ............... 324/753 |
| 5,576,630 A | * | 11/1996 | Fujita | ............... 324/760 |
| 6,066,956 A | * | 5/2000 | Nikawa | ............... 324/752 |
| 6,146,014 A | * | 11/2000 | Bruce et al. | ............... 374/161 |
| 6,169,408 B1 | * | 1/2001 | Kantor et al. | ............... 324/752 |
| 6,488,405 B1 | * | 12/2002 | Eppes et al. | ............... 374/5 |

* cited by examiner

*Primary Examiner*—Michael Tokar
*Assistant Examiner*—Emily Y Chan

(57) ABSTRACT

Defect analysis of an integrated circuit die having a back side opposite circuitry at a circuit side and a liquid crystal liquid is enhanced using near infrared (nIR) laser light. According to an example embodiment of the present invention, nIR laser light is directed to an integrated circuit die having a liquid crystal layer formed over the die. When the die includes a defect that generates heat, the heat generated in the die as a result of the nIR laser light adds to the heat in the die generated as a result of the defect and causes a portion of the liquid crystal layer to change phase near the defect. The phase change is detected and used to identify a portion of the die having a defect.

24 Claims, 2 Drawing Sheets

INTEGRATED CIRCUIT DEFECT ANALYSIS USING LIQUID CRYSTAL

FIELD OF THE INVENTION

The present invention relates generally to semiconductor devices and their fabrication and, more particularly, to semiconductor devices and their manufacture involving techniques for analyzing and debugging circuitry within an integrated circuit.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that an individual die is functional, it is also important to ensure that batches of dice perform consistently. In addition, the ability to detect a defective manufacturing process early is helpful for reducing the number of defective devices manufactured.

Traditionally, integrated circuits have been tested using methods including directly accessing circuitry or devices within the integrated circuit. Directly accessing the circuitry is difficult for several reasons. For instance, in flip-chip type dice, transistors and other circuitry are located in a very thin epitaxially grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the die.

One integrated circuit analysis method for conventional and flip-chip type dies involves using a liquid crystal material for detecting defects from the front side of an integrated circuit. Liquid crystalline materials have both crystalline solid and liquid characteristics. These characteristics enable their use for thermally analyzing an integrated circuit for defects. When the liquid crystal material is heated, its properties change. One such example change is a color change, and another change is an ordering transition. Available defect analysis methods use the change as an indication of temperature in an integrated circuit, which is useful for detecting defects that cause heat generation. By forming a liquid crystal layer on an integrated circuit, the response of the liquid crystal can be monitored and used to detect hot spots that are an indication of a defect.

One type of liquid crystalline material useful for front side defect analysis is calamatic liquid crystal material having nematic ordering. Calamatic liquid crystals have long, rod-shaped molecules, and those having nematic ordering change under temperature variation from a nematic to an isotropic state. In the nematic state, the liquid crystal alters the polarization of light incident upon it. When the liquid crystal changes to an isotropic state, the polarization of incident light is no longer affected. This change in the effect upon incident light is used to detect a temperature change in the liquid crystal material. The transition temperature at which the change occurs is dependent upon the particular characteristics of the material.

Typical analysis methods that use liquid crystals involve forming a liquid crystal layer on an integrated circuit and observing a change in the state of the liquid crystal that results from heat generated in the die. The liquid crystal layer is often formed by adding a solvent, such as pentane, to the liquid crystal material and then applying the material to the surface of an integrated circuit device with an eye-dropper. The solvent evaporates, leaving the liquid crystal material behind. Other liquid crystal application methods include applying liquid crystal with a spreading strip, and applying a drop of liquid crystal on the chip and spinning the chip to spread out the liquid crystal. In addition, a liquid crystal emulsion may be used in place of the liquid crystal mixed with a solvent.

Once the liquid crystal has been applied, the integrated circuit is then heated with an external heater. The heater is used to bring the integrated circuit close to the transition temperature of the liquid crystal material. A microscope is directed at the liquid crystal layer. A suitable microscope includes a polarized light source and a linear polarizer (analyzer) in front of an eyepiece or camera. The integrated circuit is electrically stimulated, thereby heating a defect in the circuit and raising the liquid crystal material over the defect to its transition temperature. The liquid crystal material changes from nematic to isotropic phase, which is evidenced by a dark spot that is detected by the microscope.

In many applications, heating the defect via electrical stimulation causes a phase change that occurs too quickly to easily detect. In addition, heat from intrinsic heat sources in the die can overwhelm heat generated by a defect, making such analysis difficult.

SUMMARY OF THE INVENTION

Addressing the above and other concerns, the present invention is directed to the analysis of an integrated circuit die involving defect detection using liquid crystal. The defect detection can be used via the back side or the front side of the die, and can be used to detect defects located near intrinsic heat sources that make conventional liquid crystal analysis difficult or even impossible. The present invention is exemplified in a number of implementations and applications, some of which are summarized below.

According to an example embodiment of the present invention, an integrated circuit die is analyzed using near infrared (nIR) laser light to induce a phase change in a portion of a layer of liquid crystal over the die. The nIR laser light passes through the liquid crystal layer and causes heat generation at circuitry in the die. When a portion of the circuitry is defective, more heat is generated at the defective circuitry than at non-defective circuitry. The excess heat generated at the defective circuitry causes the liquid crystal phase change, which is used to detect the defect.

According to another example embodiment of the present invention, a system is adapted for analyzing an integrated circuit die having a back side opposite circuitry at a circuit side and having a liquid crystal layer formed over a portion of the die. A laser source is adapted to direct near infrared (nIR) laser light at circuitry in the die via the liquid crystal layer and generate heat at the circuitry, such as described above. A detection arrangement is adapted to detect a defect in the die by detecting a portion of the liquid crystal changing phase.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
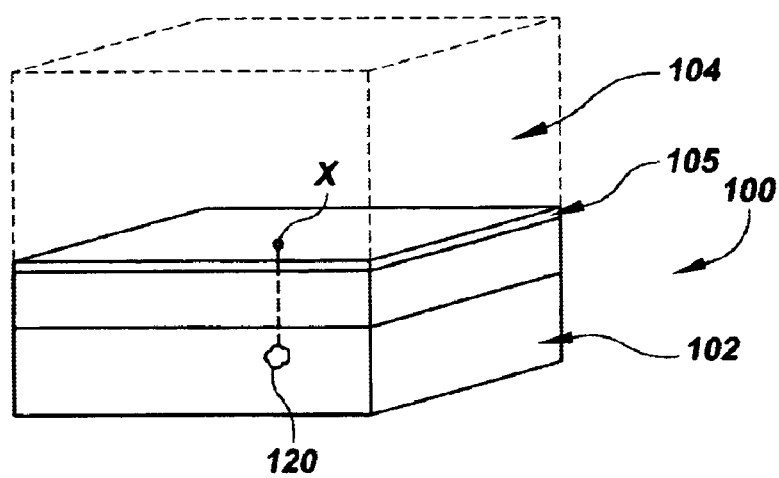
FIG. 1A shows an integrated circuit die undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable for a variety of different types of semiconductor devices, and the invention has been found to be particularly suited for integrated circuit dies having one or more defects that generates heat in the die. While the present invention is not necessarily limited to such devices, various aspects of the invention may be appreciated through a discussion of various examples using this context.

According to an example embodiment of the present invention, a liquid crystal layer is formed on an integrated circuit die and used in connection with nIR laser light to detect one or more defects in the die. When the die is operated, defective circuitry in the die generates more heat than non-defective circuitry. In connection with this example embodiment, it has been discovered that nIR laser light (e.g., having a wavelength of about 1.3 microns) can be used to generate enough heat in the die, when combined with the heat generated at the defective circuitry, to cause a portion of the liquid crystal near the defective circuitry to change phase. The phase change is used to detect the portion of the circuitry in the die that is defective. This defect detection is applicable to a variety of integrated circuit dies, such as conventional dies and flip chip dies, and can be accomplished via the front side and the back side of the die.

In a more specific example embodiment of the present invention, the die is operated at a near failure condition and nIR laser light is directed at the die via the liquid crystal layer. The liquid crystal used is transparent to the nIR laser light such that the light passes through the liquid crystal layer without necessarily heating the liquid crystal. Radiation from the nIR light is absorbed by the die and converted to heat using, for example, free carrier or phonon absorption (e.g., vibrational energy resulting from nIR radiation). The radiation is absorbed at one or more regions of the die, such as at the circuitry or at silicon that converts the light energy to heat energy. The near failure operation of the die causes the liquid crystal to heat to a point near its phase transition temperature. Heat generated in response the nIR laser light pushes a portion of the liquid crystal near the defect to the phase transition temperature, which causes a detectable phase change in the liquid crystal. The phase change is used to detect the location of the circuitry in the die over which the liquid crystal has changed phase, and thus identifies that portion of the circuitry as having a suspect defect.

Figure 1B:
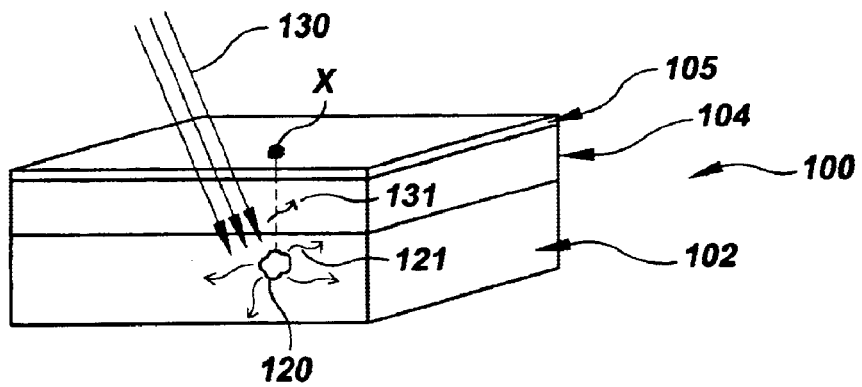
FIG. 1B shows the integrated circuit die of FIG. 1A undergoing analysis, according to another example embodiment of the present invention.

FIGS. 1A and 1B show a flip chip die 100 undergoing liquid crystal analysis, according to a more particular example embodiment of the present invention. In FIG. 1A, a portion (shown dashed) of a backside 104 is removed to form a thinned region, and a layer of liquid crystal material 105 is formed over the thinned region. The removal of the backside portion 104 may be achieved using, for example, conventional polishing and etching processes, such as chemical-mechanical polishing (CMP) and laser etching. The die has a circuit region 120 in the circuit side 102 and located below region X of the liquid crystal layer 105. The thinning is effected to improve heat transfer from the circuitry in the die to the liquid crystal layer while maintaining the integrity of the circuitry in the die.

The die is operated at FIG. 1B, and the circuit region 120 heats in response to the operation. In one particular implementation, the die operation includes operating the die in a loop known to generate a failure. The failure may be generated in a variety of manners, such as by using an IC tester to repeatedly generate a set of test inputs (e.g., test vectors) known to cause a certain circuit reaction, (e.g., generating a failure state). The test inputs may include, for example, input voltages that are provided to the die all at once or in a predetermined sequence in order to produce a desired response in the form of one or more output states as defined by output voltages of the die. The nIR laser light 130 is also directed at the die and generates heat 131 near the circuit region 120. The heat 121 generated by the circuit region 120 and the nIR-generated heat 131 combine to heat nearby portions of the die. The backside 104 has been sufficiently thinned to facilitate heat transfer from the circuit region 120 in a manner that enables the heating of the liquid crystal layer at region X. The amount, or sufficiency, of the thinning is dependent upon the application and the type of die being analyzed. As the liquid crystal near region X reaches its transition temperature, it becomes black when viewed. The black portion is used to detect the location of the circuit region 120.

The liquid crystal phase change is detected and used for analyzing the die in a variety of manners. In one application, a microscope having a polarized light source, an analyzer, and a camera is arranged over the back side of a die having a liquid crystal layer formed thereon. As the liquid crystal reaches its transition temperature, it changes phase and the phase change is detectable as a dark area when viewed with the microscope. For instance, when calamatic liquid crystal having a nematic ordering is used, the change between a nematic and isotropic state affects the polarization of light incident upon it, which is detectable as discussed. This defect-driven phase change is recorded using the microscope and the camera and used to determine the location of the defect. In another implementation, the camera is used to obtain an image of the circuitry in the die, and the detected phase change (dark area) is imaged and overlayed onto the circuit image. The circuit image can also be used to navigate the nIR laser to a selected portion of circuitry in the die for generating heat at the selected portion. For instance, the position of the selected portion of the circuitry, relative to a reference location, can be identified using the image and the laser can be directed to the selected portion using the known relative location. In another implementation, the microscope includes an nIR laser that is adapted to obtain an image of the liquid crystal phase change, to obtain an image of the circuitry and to induce heat generation in the die.

The type of liquid crystal used can be selected based upon the type of analysis that is to be performed. For example types of liquid crystal material suitable for use in connection with the present invention, reference may be made to T. W. Lee & S. V. Pabbisetty, *Liquid Crystal Microscopy*, in MICROELECTRONIC FAILURE ANALYSIS 141 (3$^{rd}$ ed., ASM International, 1993). Such liquid crystal is available from various sources and can be chosen to provide a state transition temperature (STT) that is just over room temperature for near-room temperature applications. Other liquid crystal material may be used in applications requiring or benefiting from different properties, such as liquid crystal having a STT that is higher or lower for applications where the testing is done at a different temperature.

According to another example embodiment of the present invention, the operation of an nIR laser that generates the nIR laser light is varied, such as by pulsing the laser. By varying the operation of the laser, the amount of heat generated as a result of the nIR laser light can be more accurately controlled. This is useful for controlling the progression of the liquid crystal phase change. For instance, it is sometimes challenging to identify a portion of the liquid crystal that changes phase first because a large portion of the liquid crystal may undergo a phase change almost simultaneously. By pulsing the laser, the heat generation can be slowed, which in turn can result in a slower phase transition of the liquid crystal layer. A camera can then more easily identify the liquid crystal that changes phase first as a result of the defect, and thus the location of the defect can be better identified.

In another example embodiment of the present invention, additional testing is performed to further identify the defect after the defect is detected using the liquid crystal phase change. In one particular implementation, the additional testing includes cooling the die and repeating one or more of the example analyses above. The liquid crystal phase change is repeatedly detected and used to obtain an averaged phase change response of the liquid crystal. This implementation is particularly useful for detecting a weak response from the liquid crystal.

Figure 2:
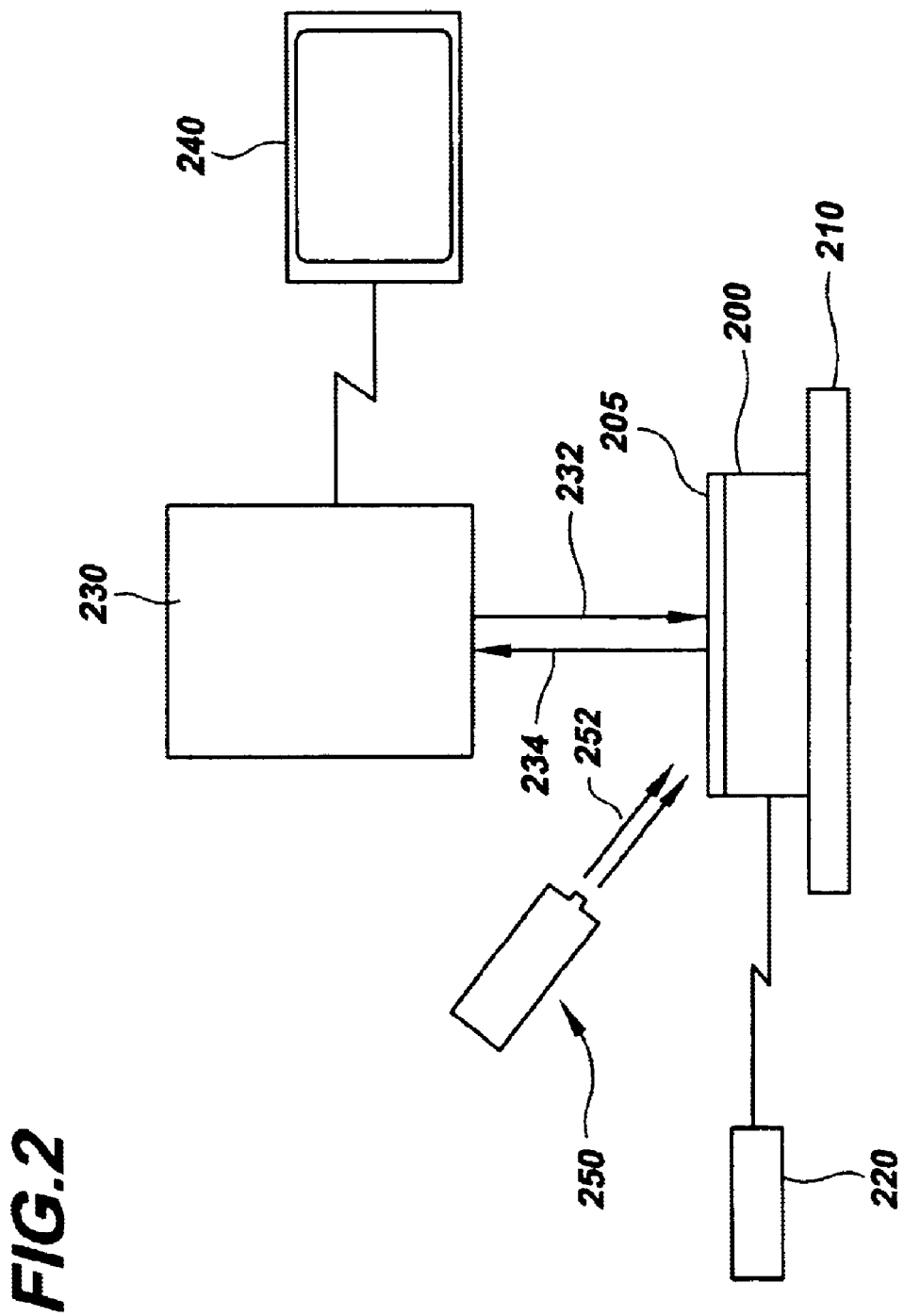
FIG. 2 shows a system for analyzing an integrated circuit die, according to another example embodiment of the present invention.

FIG. 2 is a system adapted to detect a defect using a liquid crystal phase change, according to another example embodiment of the present invention. The system includes a movable stage 210 adapted to hold an integrated circuit die 200 having a liquid crystal layer 205 formed over a portion of the die. A power supply 220 is coupled and adapted to supply power to the die and to generate heat in circuitry in the die. An nIR laser 250 is adapted to direct laser light 252 at the die and to induce heat generation in response thereto. In one implementation, the laser light 252 is directed at selected circuitry in the die (e.g., circuitry suspected as having a defect), and in another implementation the laser is raster scanned across the entire die. An analysis arrangement 230 is arranged over the liquid crystal layer 205 and is adapted to capture an image of the liquid crystal as it changes phase due the heat generated. A polarized light source is adapted to direct polarized light 232 at the die 200. An analyzer (linear polarizer) is arranged so that an image 234 from the die 200 passes through it before it is captured. In one particular implementation, the detection arrangement 230 includes a laser scanning microscope having a polarized laser source adapted to create a laser beam having a wavelength of about 1064 nanometers, and an analyzer. In another implementation, the detection arrangement 230 includes an nIR scanning optical microscope (SOM). In addition, the detection arrangement optionally includes a monitoring arrangement 240 adapted to display an image of the phase change of the liquid crystal layer 205.

In another example embodiment, one or both of the nIR laser 250 and the power supply 220 are further adapted to modulate the amount of heat generated in the die. For example, altering the clock frequency of the power source may cause the die to speed up, draw more power and generate more heat, and pulsing the laser can affect the rate at which heat is generated at the die.

In another example embodiment of the present invention (not shown), the system of FIG. 2 further includes a die preparation arrangement adapted to provide the integrated circuit die having the liquid crystal layer formed thereon. In one application, the die preparation arrangement includes one or more of a CMP device and a laser etching device. In another application, the die preparation arrangement includes a liquid crystal application device adapted to form the liquid crystal layer in a manner such as described above and in the references above.

As discussed above, the present invention is applicable to a variety of integrated circuit dies. In this regard, and for more information generally regarding integrated circuit analysis and specifically regarding the use of liquid crystal in the analysis of integrated circuit dies, reference may be made to U.S. patent application Ser. No. 09/520,597, now U.S. Pat. No. 6,488,405 entitled "Flip Chip Defect Analysis Using Liquid Crystal" and filed on Mar. 8, 2000, which is fully incorporated herein by reference.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing an integrated circuit die having a back side opposite circuitry at a circuit side and having a liquid crystal layer formed over a portion of the die, the method comprising:

directing near infrared (nIR) laser light at circuitry in the die via the liquid crystal layer and generating heat at the circuitry; and detecting a defect in the die by detecting a portion of the liquid crystal changing phase.

2. A method for analyzing an integrated circuit die having a back side opposite circuitry at a circuit side and having a liquid crystal layer formed over a portion of the die, the method comprising:

operating a circuit portion in the die near a failure condition;

directing near infrared (nIR) laser light at circuitry in the die via the liquid crystal layer and generating heat at the circuitry including adding enough heat to the circuit portion to cause the liquid crystal over the circuit portion to change phase; and detecting a defect in the die by detecting a portion of the liquid crystal changing phase.

3. The method of claim 2, wherein operating the circuit portion includes generating enough heat at the circuit portion to cause the liquid crystal over the circuit portion to approach a threshold temperature at which the liquid crystal changes phase and wherein adding enough heat to the circuit portion with the nIR laser light includes causing the liquid crystal to reach the threshold temperature and change phase.

4. The method of claim 2, wherein operating the circuit portion includes operating the die in a continuous loop at a near failure condition.

5. The method of claim 1, wherein generating heat at the circuitry with the nIR laser light includes causing the circuitry to absorb laser radiation.

6. The method of claim 5, wherein causing the circuitry to absorb laser radiation includes causing the circuitry to absorb at least one of: free carriers and phonons.

7. The method of claim 1, further comprising using the nIR laser light to image the die and using the image to identify the portion of circuitry that causes the liquid crystal to change phase.

8. The method of claim 1, further comprising using the nIR laser light to image the die and using the image to identify a circuit portion for analysis, wherein directing the nIR laser light at circuitry includes directing the laser light to the identified circuit portion.

9. The method of claim 1, wherein generating heat at the circuitry includes using silicon in the die to convert light energy from the laser into heat energy.

10. The method of claim 1, wherein directing nIR light at the circuitry includes using a near infrared (nIR) scanning optical microscope (SOM) to scan the die with a laser beam.

11. The method of claim 1, wherein the integrated circuit die includes a flip chip die having a thinned region in the back side and having the liquid crystal layer formed over the thinned region, wherein directing the nIR laser at circuitry in the die includes directing the nIR laser at circuitry via the thinned back side.

12. The method of claim 1, wherein directing nIR laser light includes directing laser light having a wavelength of about 1.3 microns.

13. The method of claim 1, wherein directing nIR laser light includes raster scanning the nIR laser light across the die.

14. The method of claim 1, wherein detecting a portion of the liquid crystal changing phase includes using the nIR laser light to image the liquid crystal and using the image to detect the portion of the liquid crystal changing phase.

15. A method for analyzing an integrated circuit die having a back side opposite circuitry at a circuit side and having a liquid crystal layer formed over a portion of the die, the method comprising:

directing near infrared (nIR) laser light at circuitry in the die via the liquid crystal layer and generating heat at the circuitry; and detecting a defect in the die by detecting a portion of the liquid crystal changing phase including using the nIR laser light to image the liquid crystal, using the image to detect the portion of the liquid crystal changing phase, and evaluating a plurality of images of the liquid crystal.

16. A method for analyzing an integrated circuit die having a back side opposite circuitry at a circuit side and having a liquid crystal layer formed over a portion of the die, the method comprising:

directing near infrared (nIR) laser light at circuitry in the die via the liquid crystal layer and generating heat at the circuitry; and detecting a defect in the die by detecting a portion of the liquid crystal changing phase including using the nIR laser light to image the liquid crystal, using the image to detect the portion of the liquid crystal changing phase, and overlaying the image of the liquid crystal onto an image of the die circuitry and matching the portion of the liquid crystal changing phase to a defective circuit portion in the die.

17. The method of claim 1, further comprising removing sufficient amount of substrate from the die for heat transfer from the circuitry to the liquid crystal in a manner that causes a portion of the liquid crystal to reach a temperature near its threshold temperature for changing phase, wherein the liquid crystal is formed over the die after the substrate removal.

18. The method of claim 1, wherein directing nIR laser light includes varying the operation of an nIR laser.

19. The method of claim 18, wherein varying the operation of the nIR laser includes pulsing the laser.

20. A system for analyzing an integrated circuit die having a back side opposite circuitry at a circuit side and having a liquid crystal layer formed over a portion of the die, the system comprising:

means for directing nIR laser light at circuitry in the die via the liquid crystal layer and generating heat at the circuitry; and means for detecting a defect in the die by detecting a portion of the liquid crystal changing phase.

21. A system for analyzing an integrated circuit die having a back side opposite circuitry at a circuit side and having a liquid crystal layer formed over a portion of the die, the system comprising:

a laser source adapted to direct near infrared (nIR) laser light at circuitry in the die via the liquid crystal layer and generate heat at the circuitry; and a detection arrangement adapted to detect a defect in the die by detecting a portion of the liquid crystal changing phase.

22. The system of claim 21, wherein the laser source includes a near infrared scanning optical microscope (nIR SOM).

23. The system of claim 22, wherein the detection arrangement includes the nIR SOM and is adapted to detect an image of a portion of the liquid crystal having changed phase.

24. The system of claim 23, wherein the nIR SOM is adapted to detect images of the liquid crystal over time and to generate an image of a portion of the liquid crystal having undergone a phase change as an average of the liquid crystal images.

* * * * *